US00RE37059E

(19) United States
(12) Reissued Patent
Abe et al.

(10) Patent Number: US RE37,059 E
(45) Date of Reissued Patent: Feb. 20, 2001

(54) WIRING PATTERN OF SEMICONDUCTOR INTEGRATED CIRCUIT DEVICE

(75) Inventors: Masahiro Abe, Yokohama; Yasukazu Mase, Fuyisawa; Tomie Yamamoto, Yokohama, all of (JP)

(73) Assignee: Kabushiki Kaisha Toshiba, Kawasaki (JP)

(21) Appl. No.: 09/090,401

(22) Filed: Jun. 4, 1998

Related U.S. Patent Documents

Reissue of:
(64) Patent No.: 5,523,627
Issued: Jun. 4, 1996
Appl. No.: 08/375,690
Filed: Jan. 20, 1995

U.S. Applications:

(63) Continuation of application No. 08/077,946, filed on Jun. 18, 1993, now Pat. No. 5,411,916, which is a continuation of application No. 07/808,744, filed on Dec. 17, 1991, now abandoned, which is a division of application No. 07/609,601, filed on Nov. 6, 1990, now Pat. No. 5,126,819.

(30) Foreign Application Priority Data

Nov. 10, 1989 (JP) ..... 1-293490

(51) Int. Cl.[7] ..... G11C 13/00
(52) U.S. Cl. ..... 365/51; 361/52
(58) Field of Search ..... 365/51, 52, 63, 365/182, 189.01

(56) References Cited

U.S. PATENT DOCUMENTS 4,196,443 * 4/1980 Dingwell .
4,381,215 * 4/1983 Reynolds et al. .
4,482,914 * 11/1984 Mano et al. .
4,812,419 * 3/1989 Lee et al. .
5,072,411 * 12/1991 Yamaki .
5,126,819 * 6/1992 Abe et al. .
5,138,700 * 8/1992 Kinoshita .
5,140,693 * 8/1992 Nimomiya .
5,411,916 * 5/1995 Abe et al. .

FOREIGN PATENT DOCUMENTS

0166344 * 1/1986 (EP) .
0289274 * 4/1988 (EP) .
0414412 A2 8/1990 (EP) .
2029097 * 3/1980 (GB) .
57-201171 * 12/1982 (JP) .
59014649 1/1984 (JP) .
59169150 9/1984 (JP) .
59-188149 * 10/1984 (JP) .
60-208845 * 10/1985 (JP) .
60242643 12/1985 (JP) .
61131469 6/1986 (JP) .
61-194848 * 8/1986 (JP) .
63-78554 * 4/1988 (JP) .
63-292672 * 11/1988 (JP) .
1-305531 * 12/1989 (JP) .

OTHER PUBLICATIONS

R.E. Oakley et al. "Pillars—The Way to Two Micron Pitch Multilevel Metallization" IEEE VLSI Multilevel Interconnection Conference Proceedings Jun. 21–24, 1984 pp. 23–29.*

R.R. Joseph et al., "Reduced Electromigration Damage at AL Contacts to Si Integrated Circuits," IBM Technical Disclosure Bulletin, vol. 15, No. 2 Aug., 1972 pp. 725–726.*

S.M. Sze, Semiconductor Devices, Physics and Technology, 486–488, (1985).

* cited by examiner

*Primary Examiner*—Terrell W. Fears

(57) ABSTRACT

As shown in FIG. 4, a wiring pattern of a semiconductor integrated circuit device of the present invention comprises a wiring portion extending from a connection hole and a connection portion located on the connection hole and having a matching allowance with respect to said connection hole on said wiring portion side being formed wider than a predetermined matching allowance by a predetermined width with which a required yield of successful matching can be assured.

31 Claims, 5 Drawing Sheets

WIRING PATTERN OF SEMICONDUCTOR INTEGRATED CIRCUIT DEVICE

Matter enclosed in heavy brackets [ ] appears in the original patent but forms no part of this reissue specification; matter printed in italics indicates the additions made by reissue.

This is a continuation of application Ser. No. 08/077,946, filed Jun. 18, 1993, U.S. Pat. No. 5,411,916, which is a continuation of application Ser. No. 07/808,744, filed Dec. 17, 1991 now abandoned, which is a rule 60 divisional of application Ser. No. 07/609,601, filed Nov. 6, 1990, now U.S. Pat. No. 5,126,819, issued Jun. 30, 1992.

BACKGROUND OF THE INVENTION

1. Field of the Invention

The present invention relates to wiring pattern of a semiconductor integrated circuit device, and more particularly to the technique of matching the allowance between a connection hole, such as a contact hole or through hole, and a wiring.

2. Description of the Related Art conventionally, the matching allowance between a connecting hole (e.g., a contact hole or a through hole) and a wiring is set equally around the connecting holes, in order to compensate for the deviation which occurs in the step of lithography, randomly in every direction. When the deviation is zero, the width of the wiring around the connection hole, the around width H, at the periphery of the connecting hole is formed as shown in FIGS. 1A and 1B. FIGS. 1A and 1B illustrate a connecting hole 11, wiring layer 12, and an inter-layer insulation layer 13.

As is shown in FIG. 1B, a notch S is formed in the wiring layer in the connection hole 11. When electric current flows through the connection hole 11, resistance against the current increases at the section where the notch S is located. The wiring resistance around connection hole 11 (to be called "connection hole resistance" hereinafter) can be substituted with an equivalent circuit shown in FIG. 2, which is designed so that when a deviation between the connection hole 11 and the pattern of the wiring 12 is zero, current paths $I_2$ and $I_2'$ on the wiring extension side become wide.

In reality, however, due to a matching error $\alpha$ in the step of pattern matching, a variety of deviations may occur between the connection hole 11 and the wiring layer 12.

FIGS. 3A to 3C illustrate several examples of matching deviation between the connection hole 11 and the wiring layer 12.

FIG. 3A shows a case where the connection hole 11 deviates in the direction opposite to the wiring extension side. In this case, as the around width $B_1$ narrows, resistances $R_3$ and $R_3'$ inevitably increase. However, electrical current $i_3$, which is affected by the resistances, comprise a very small portion of the total current. Further, as the around width $B_2$ widens, resistances $R_2$ and $R_2'$ decrease. Therefore there is little change in connection hole resistance as a whole.

FIG. 3B shows a case where the connection hole 11 deviates in the vertical direction toward the wiring extension side. In this case, around width $C_1$ narrows and around width $C_2$ widens. Therefore resistances $(R_2+R_3)$ and $(R_2'+R_3')$ respectively increase and decrease, thereby canceling each other, so that the connection hole resistance is only slightly affected, as a whole.

FIG. 3C shows a case where the connection hole 11 deviates towards the wiring extension side. In this case, around width $B_2$ narrows, and the effective current paths $I_2$ and $I_2'$ narrow, whereby the connection hole resistance inevitably increases. More specifically, current flows through all of resistances $r_1$, $R_2$ and $R_3$. As around width $B_2$ narrows, currents $I_2$ and $I_2'$ flowing through resistances $R_2$ and $R_2'$ decrease, and current $i_1$ flowing through resistance $r_1$, which becomes high due to device structure, increases. Therefore, the matching deviation directly affects the connection hole resistance, and disconnection of the wiring due to heat-emission or electromigration may occur at the notch S.

SUMMARY OF THE INVENTION

The object of the present invention is to provide a wiring pattern of a semiconductor integrated circuit device in which the connection hole resistance does not increase even if matching deviation between a connection hole such, as a contact hole or through hole, and a wiring layer occurs.

To achieve the above-mentioned object, the wiring pattern of the semiconductor integrated circuit device according to the present invention comprises a wiring portion extending from the connection hole and a connection portion located above the connection hole and connected to the wiring portion so that it makes an obtuse angle, in which a matching allowance for the connection hole on the wiring portion side is formed wider than the regular matching allowance by a predetermined width with which a required yield of successful matching can be assured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1A:
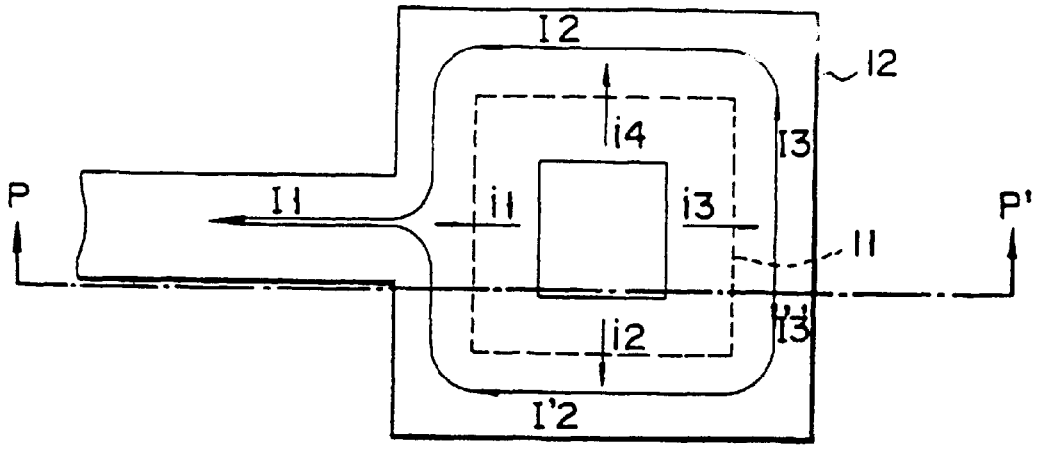
F I G. 1A (PRIOR ART)
FIG. 1A is a plane view of the wiring pattern of a conventional semiconductor integrated circuit device.
Figure 1B:
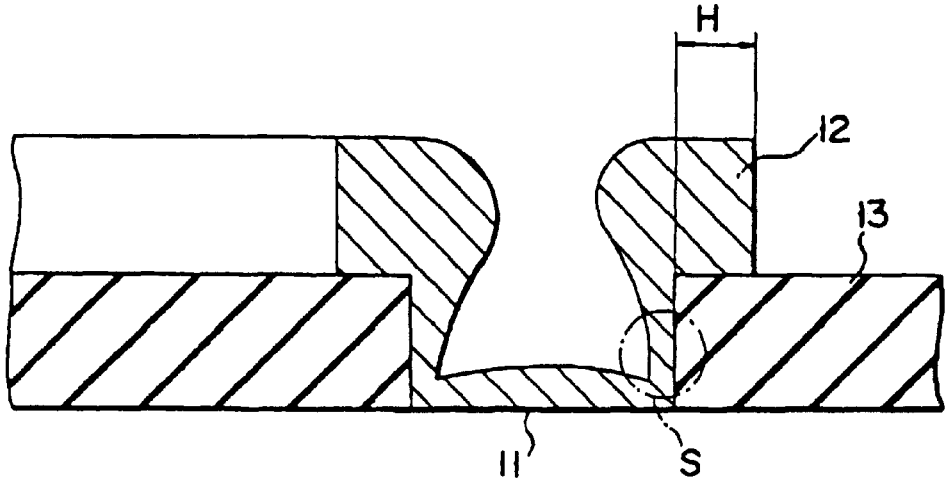
F I G. 1B (PRIOR ART)
FIG. 1B is a cross-sectional view of FIG. 1A along the line P—P'.
Figure 2:
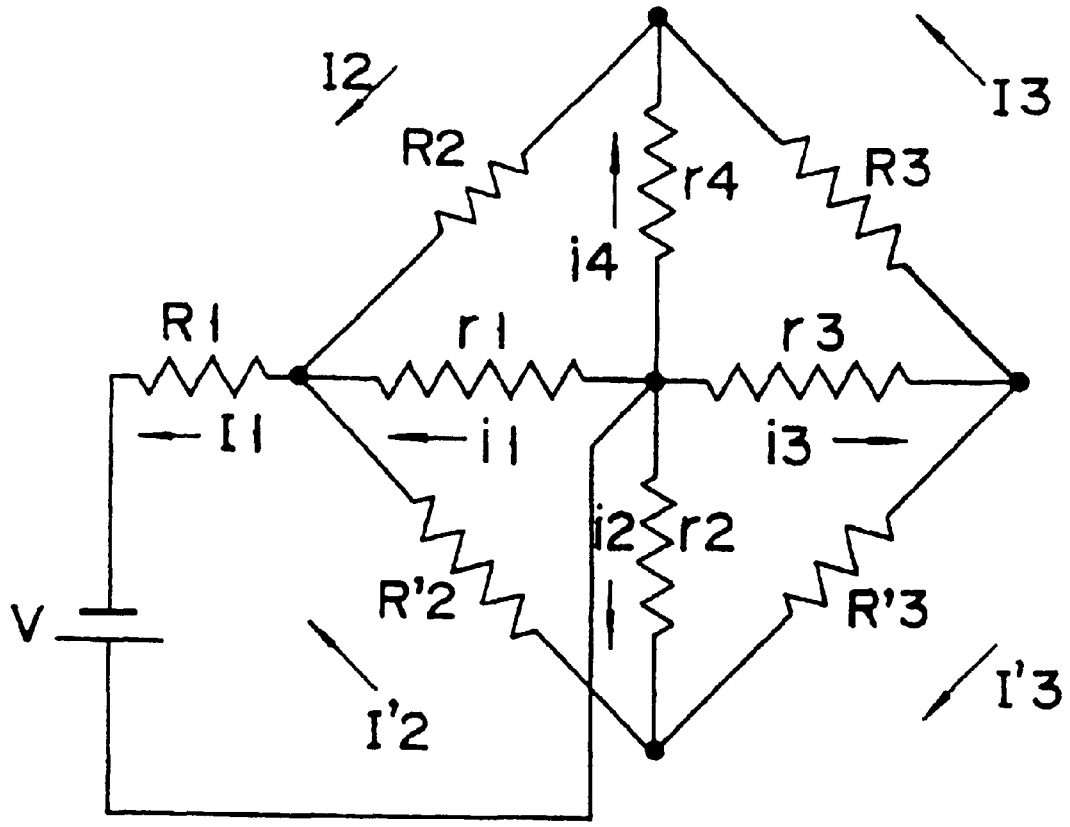
FIG. 2 (PRIOR ART)
FIG. 2 is a conventional equivalent circuit of the wiring resistance of a wiring near a connection hole, such as a contact hole or hole through hole.
Figure 3A:
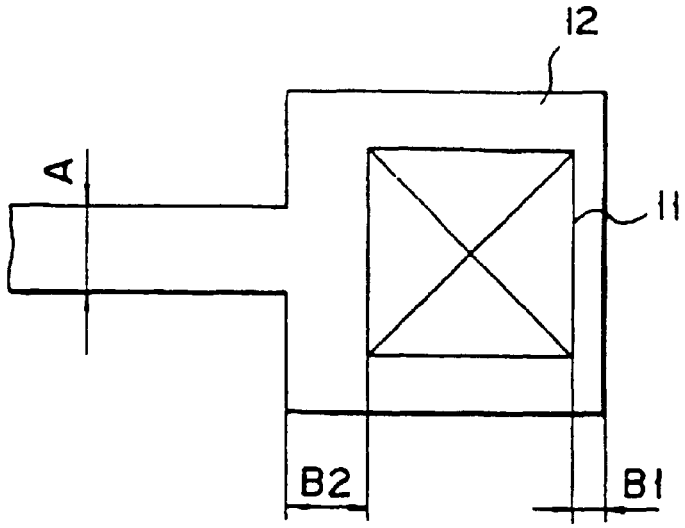
FIG. 3A (PRIOR ART)
FIGS. 3A–3C are cross-sectional views of examples of conventional matching deviation between the connection hole and the wiring.
Figure 3B:
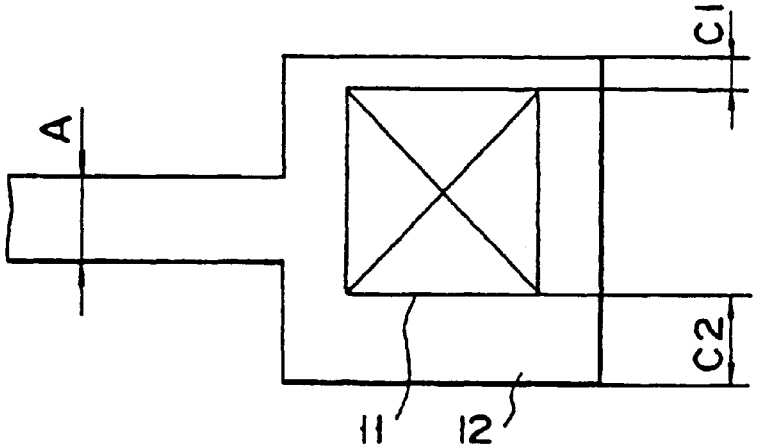
FIG. 3B (PRIOR ART)
Figure 3C:
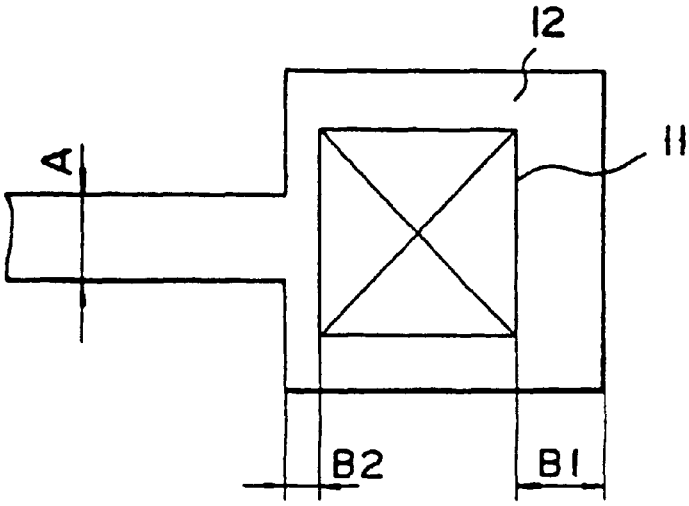
FIG. 3C (PRIOR ART)

A wiring pattern of a semiconductor integrated circuit device according to an embodiment of the present invention will be described with reference to the accompanying drawings wherein like reference numerals designate like items and explanations thereof are omitted.

Figure 4:
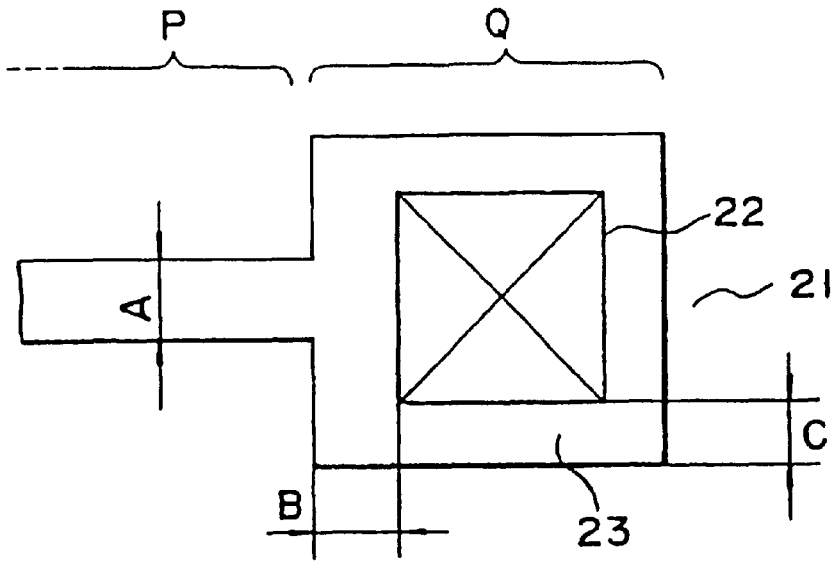
FIG. 4 is a plane view of a wiring pattern of a semiconductor integrated circuit device according to an embodiment of the present invention.

FIG. 4 shows a wiring pattern of a semiconductor integral circuit according to a first embodiment of the present invention, including a semiconductor substrate 21, a connection hole 22, a wiring layer 23, a wiring width A, matching allowances between the connection hole and the wiring layer B and C, a wiring portion P, and a connection portion Q.

The connection hole 22 such as a contact hole or a through hole, is formed in the semiconductor substrate 21, and the wiring layer 23 is formed around the connection hole 22. The wiring layer 23 consists of the wiring portion P, which is a wiring portion extending in one direction from a side of the square-shaped connection hole 22, and connection portion Q, which is a wiring portion located adjacent to the connection hole 22. The matching allowance B on the wiring portion P side of the connection portion Q is formed so that it has a predetermined width, in other words, a width with which a sufficient current path can be obtained when the matching deviation of the wiring layer 23 is set to zero. The matching allowance B on the wiring portion P side is set so that it is a predetermined width wider than the regular matching allowance to cover the necessary matching efficiency. The matching allowance C at the sides other than the wiring portion P side is set to an appropriate width so that the pattern of the wiring layer 23 does not become too large.

For example, suppose that the minimum around width of the wiring portion P side for obtaining a sufficient electric current path is about 1.0 $\mu$m, when the required yield of the successful allowance is $3\sigma$ ($\sigma$ is a value for dispersion in the normal distribution), and the predetermined width with which $3\sigma$ can be assured is about 0.5 $\mu$m, the allowance B on the wiring portion P side should be set to about 1.5 $\mu$m to obtain a sufficient current path. When the matching deviation of the wiring is zero, the around width is about 1.5 $\mu$m as originally designed for the width of the matching allowance B. Even if the matching deviation of the wiring is as much as 0.5 $\mu$m in the direction opposite to the wiring portion P, the around width of about 1.0 $\mu$m can be assured.

The matching allowances C for the sides other than the wiring portion P side are set to about 0.7 $\mu$m so as to obtain an around width of, for example, about 0.2 $\mu$m at a minimum. This is because, if the width of the matching allowances C is set to the same as that of the matching allowance B, the size of the wiring pattern of the wiring layer 23 around the connection hole 22 becomes very large, thereby lowering the degree of integration. The matching allowances other than that of the wiring portion P side should only be set to a minimally necessary width so that the wiring pattern does not become too large. In this embodiment, the wiring width A is set to about 2 $\mu$m, and the size of the connection hole is set to about 3.0×3.0 $\mu$m.

According to such a structure, the matching allowance B of the wiring portion P side is set a predetermined width wider than the predetermined allowance so as to cover the matching deviation even in the case where the wiring layer width deviates in the direction opposite to the wiring portion P side. Specifically, even if the wiring layer 23 deviates in the direction opposite to the wiring portion P side, a sufficient around width can be obtained within the range of the successful yield of matching allowance, so that the contact hole resistance is not increased.

Figure 5:
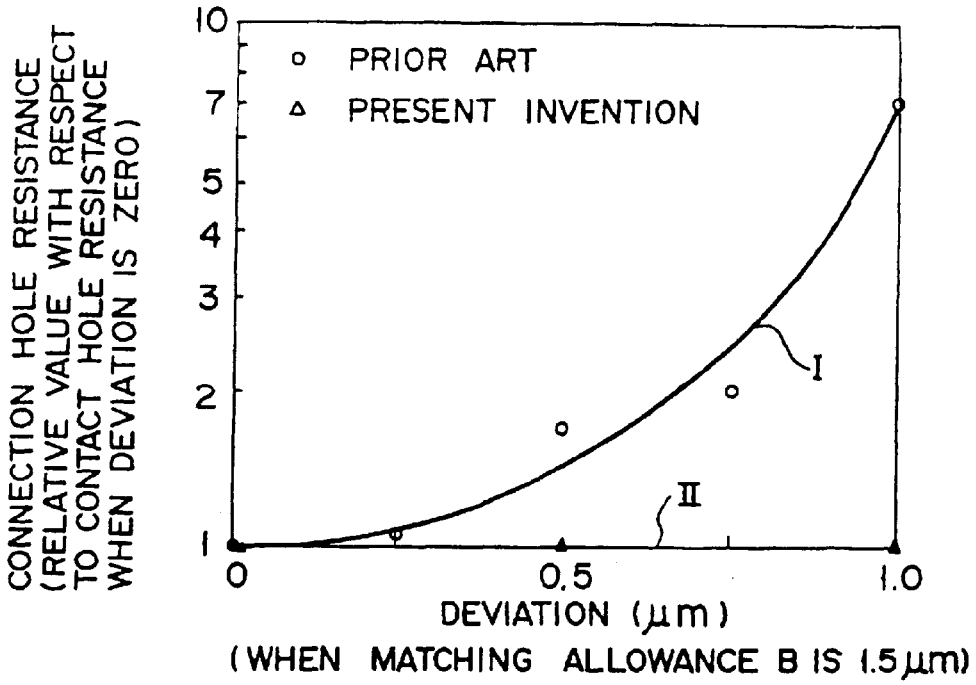
FIG. 5 shows a relationship between the matching deviation amount and the connection hole resistance comparing a conventional semiconductor device with the present invention.

In the meantime, the connection hole resistance where the wiring layer 23 includes the matching allowance B of about 1.5 $\mu$m and the matching allowance C of about 0.7 $\mu$m was measured and the result is shown in FIG. 5 as represented by straight line II. As represented by the line II, when the amount of deviation in the direction opposite to the wiring portion P side is within 1.0 $\mu$m, in other words, the around width is in the range of 0.5–1.5 $\mu$m in the wiring layer 23, no increment in the connection hole resistance was detected. Further, the connection hole resistance in the case where the matching allowances for all sides of the connection hole 22 are equally set to about 1.0 $\mu$m was measured and the result is also shown in this figure as represented by curve I.

The present invention was applied to a bipolar LSI (A/D converter) having 4,500 elements, and no decrement in the degree of integration was detected.

Figure 6:
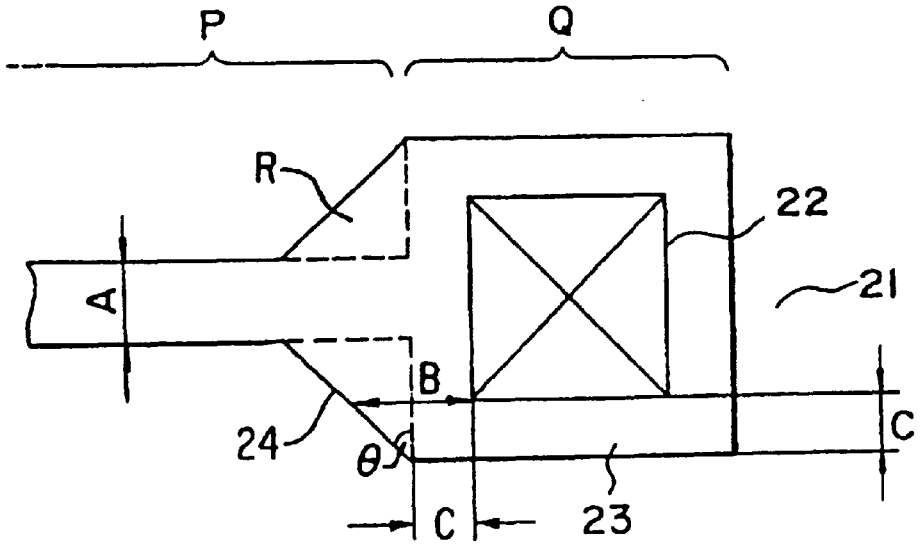
FIG. 6 is a plane view showing a wiring pattern of a semiconductor integrated circuit according to a second embodiment of the present invention.

FIG. 6 shows a wiring pattern of a semiconductor integrated circuit device according to a second embodiment of the present invention.

As shown in FIG. 6, the connection hole 22, such as a contact hole, or through hole is formed on the semiconductor substrate 21, and the wiring layer 23 is formed on the connection hole 22. In the wiring layer 23, the wiring portion P and the contact portion Q are connected by a portion R of portion P so that an oblique external edge of portion R makes obtuse angles (greater than 90° and less than 180°) with the adjoining horizontal external edges of portions P and Q. The first embodiment mentioned above is a case where the wiring portion P and the contact portion Q are connected at a right angle, so that the matching allowance B will always be no more than the dimension C. In FIG. 6, the matching allowance B of the wiring portion P side is formed wider than a predetermined width to assure a sufficient current path when the matching deviation of matching pattern is set to zero. In detail, the matching allowance B is formed wider than the predetermined matching allowance C by a predetermined width which assures the required yield of successful allowance.

For example, suppose that the minimum around width of the wiring portion P side for obtaining a sufficient electric current path is about 1.0 $\mu$m. When the required yield of the successful allowance is $3\sigma$ ($\sigma$ is a value for dispersion in the normal distribution), and the predetermined width with which $3\sigma$ can be assured is about 0.5 $\mu$m, the allowance B on the wiring portion P side should be set to about 1.5 $\mu$m to obtain a sufficient current path. Further, the matching allowances other than the wiring portion P side are designed to be about 0.7 $\mu$m so as to obtain an around width of, for example, about 0.2 $\mu$m at a minimum.

With such a structure, when the wiring layer 23 deviates in the direction opposite to wiring portion P, the around width of the wiring portion P side of contact portion Q may decrease, considering the actual matching deviation and the relevant angle. However, the matching allowance B is, in advance, formed wider than the predetermined matching allowance C by a predetermined width with which the actual matching deviation can be covered. Therefore, even if the wiring layer 23 deviates in the direction opposite to the wiring portion P side, the necessary around width can be obtained, and therefore the connection hole resistance does not increase.

Figure 7:
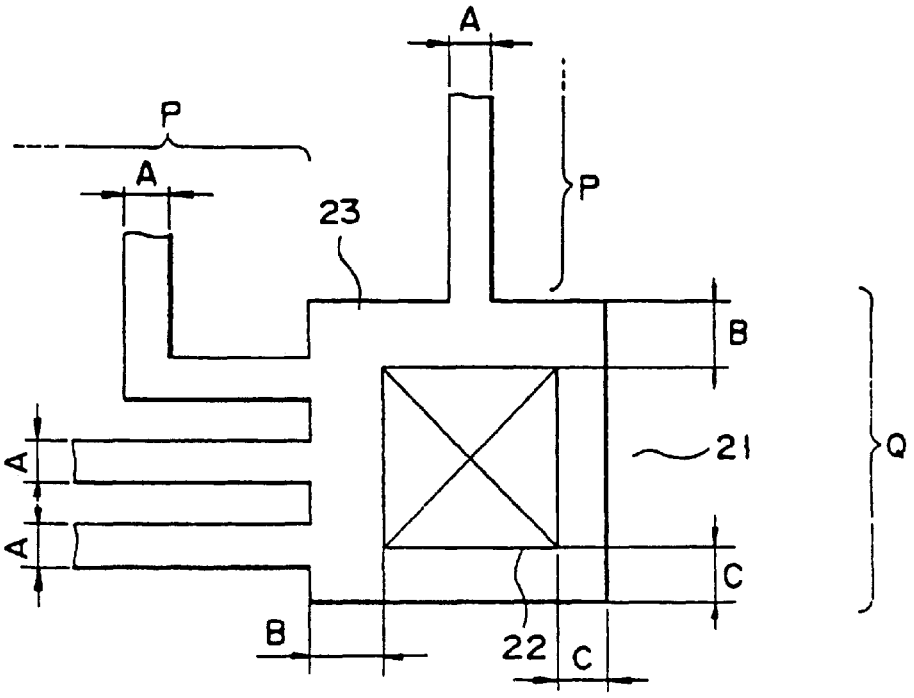
FIG. 7 is a plane view showing a wiring pattern of a semiconductor integrated circuit according to a third embodiment of the present invention.

Lastly, the above-described embodiments include the cases where there is only one wiring portion P. However, the present invention, of course, can be applied in the case where there is more than one wiring portion P, for example, as shown in FIG. 7. In this case also, there will not be any problem if the matching allowances B of each of the wiring portions P is formed wider than a predetermined matching allowance by a width with which a required yield can be assured.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A semiconductor integrated circuit device comprising:

a semiconductor substrate;

a square-shaped connection hole formed in said semiconductor substrate;

a first wiring section formed of a conductive film forming plating sidewalls of said connection hole and having four elements each having a substantially rectangular cross-section adjacent to a respective one of four edges of said connection hole, each of said four elements having a sidewall substantially aligned with a respective plating sidewall of said square-shaped connection hole adjacent to a respective one of the four edges; and a line-like second wiring section formed of a conductive film having a substantially rectangular cross-section, including a portion connected to a first element of said first wiring section at a juncture at which it has a width narrower than a length of the first element of said first wiring section adjacent to the respective edge of said connection hole, wherein said first wiring section forming plating sidewalls of said connection hole is thinner than each of said four elements from the respective one of the four edges to a major surface of the conductive film parallel to the substrate, and a first width, defined by a width of the first element at the major surface from the respective edge of said connection hole, is greater than second to fourth widths, respectively defined by corresponding widths of the second element, the third element, and the fourth element from the respective edges of said connection hole.

2. A device according to claim 1, wherein said connection hole is approximately 3.0 $\mu$m×3.0 $\mu$m square.

3. A device according to claim 1, wherein the first width is approximately 1.5 $\mu$m, and the second and third widths are approximately 0.7 $\mu$m.

4. A device according to claim 1, wherein the wiring width of said second wiring section is approximately 2.0 $\mu$m.

5. A device according to claim 1, wherein said connection hole is one of a contact hole and a through hole.

*6. A semiconductor integrated circuit device, comprising:*

*a first wiring portion formed in and around a connection hole, the connection hole having edges and a center;*

*a second wiring portion having an end portion connected to the first wiring portion, the width of the end portion being less than twice the minimum center-to-edge distance of the connection hole, the second wiring portion, the first wiring portion, and the connection hole defining first, second, and third distances;*

*the first distance being the minimum distance from the end portion of the second wiring portion to an edge of the connection hole, the edge of the connection hole closest to the end portion of the second wiring portion being a first edge;*

*the second distance being the minimum distance from a second edge of the connection hole opposite to the first edge to an edge of the first wiring portion; and*

*the third distance being the minimum distance from a third edge of the connection hole other than the first edge and the second edge to an edge of the first wiring portion;*

*wherein the first distance is greater than the second distance, the first distance is greater than the third distance, and the second distance is substantially equal to the third distance.*

*7. The device according to claim 6, wherein an angle defined by a line perpendicular to the first edge and a line perpendicular to the second edge and having a vertex at the center of the connection hole measures 180°.*

*8. The device according to claim 7, wherein an angle defined by a line perpendicular to the first edge and a line perpendicular to the third edge and having a vertex at the center of the connection hole measures 90°.*

*9. The device according to claim 8, wherein the first wiring portion includes a notch portion in the connection hole.*

*10. The device according to claim 8, wherein the connection hole has a square shape.*

*11. The device according to claim 10, wherein the connection hole is approximately 3.0 $\mu$m×3.0 $\mu$m square.*

*12. The device according to claim 8, wherein the first wiring portion has a rectangular shape around the connection hole.*

*13. The device according to claim 8, wherein the width of the end portion of the second wiring portion is approximately 2.0 $\mu$m.*

*14. The device according to claim 8, wherein the first distance is approximately 1.5 $\mu$m.*

*15. The device according to claim 14, wherein the second distance is approximately 0.7 $\mu$m.*

*16. The device according to claim 15, wherein the third distance is approximately 0.7 $\mu$m.*

*17. The device according to claim 8, wherein the connection hole is one of a connection hole and a through hole.*

*18. A semiconductor integrated circuit device, comprising:*

*a first wiring portion formed in and around a connection hole, the connection hole having edges and a center;*

*a second wiring portion having an end portion connected to the first wiring portion at a first edge of the first wiring portion, the width of the end portion being less than twice the minimum center-to-edge distance of the connection hole; and*

*a third wiring portion defined by the first wiring portion, the second wiring portion, and a straight line from one end of the first edge of the first wiring portion to the second wiring portion, an angle $\theta$ being between the straight line and the first edge of the first wiring portion, wherein ($0<\theta<\pi/2$).*

*19. The device according to claim 18, wherein the first wiring portion includes a notch portion in the connection hole.*

*20. The device according to claim 18, wherein the connection hole has a square shape.*

*21. The device according to claim 20, wherein the connection hole is approximately 3.0 $\mu$m×3.0 $\mu$m square.*

*22. The device according to claim 18, wherein the first wiring portion has a rectangular shape around the connection hole.*

*23. The device according to claim 18, wherein the connection hole is one of a contact hole and a through hole.*

*24. A semiconductor integrated circuit device comprising:*

*a first wiring portion in and around a connection hole, the connection hole having edges and a center;*

*a second wiring portion having an end portion connected to the first wiring portion at a first edge of the first wiring portion;*

*a third wiring portion defined by the first wiring portion, the second wiring portion, and a first straight line from one end of the first edge of the first wiring portion to the second wiring portion, with an angle* $\theta$ *being between the first straight line and the first edge of the first wiring portion, wherein* $(0<\theta<\pi/2)$*; and*

*a fourth wiring portion defined by the first wiring portion, the second wiring portion, and a second straight line from the other end of the first edge of the first wiring portion to the second wiring portion, with an angle* $\theta$ *being between the second straight line and the first edge of the first wiring portion, wherein* $(0<\theta<\pi/2)$.

*25. The device according to claim 24, wherein the width of the end portion of the second wiring portion is less than twice the minimum center-to-edge distance of the connection hole.*

*26. The device according to claim 24, wherein no wiring portion is connected to the edges of the first wiring portion other than said first edge.*

*27. The device according to claim 24, wherein the first wiring portion includes a notch portion in the connection hole.*

*28. The device according to claim 24, wherein the connection hole has a square shape.*

*29. The device according to claim 28, wherein the connection hole is approximately 3.0 μm×3.0 μm square.*

*30. The device according to claim 24, wherein the first wiring portion has a rectangular shape around the connection hole.*

*31. The device according to claim 24, wherein the connection hole is one of a contact hole and a through hole.*

* * * * *